United States Patent [19]

Peterson

[11] Patent Number: 4,498,546
[45] Date of Patent: Feb. 12, 1985

[54] APPARATUS FOR LIMITING ELECTROMAGNETIC INTERFERENCE RADIATION

[75] Inventor: Thomas D. Peterson, Coon Rapids, Minn.

[73] Assignee: Sperry Corporation, New York, N.Y.

[21] Appl. No.: 470,685

[22] Filed: Feb. 28, 1983

[51] Int. Cl.³ .............................................. H05K 9/00
[52] U.S. Cl. .................................... 174/35 R; 174/78; 361/424
[58] Field of Search ................... 174/35 R, 35 C, 36, 174/78; 361/424; 339/14 L

[56] References Cited

U.S. PATENT DOCUMENTS 3,322,885  5/1967  May et al. ............................. 174/78
4,362,898 12/1982  Zendle et al. ...................... 174/35 R

FOREIGN PATENT DOCUMENTS 2247897  4/1974  Fed. Rep. of Germany .... 174/35 R

Primary Examiner—A. T. Grimley
Assistant Examiner—D. A. Tone
Attorney, Agent, or Firm—James R. Bell; Thomas J. Scott; Marshall M. Truex

[57] ABSTRACT

The reduction of electromagnetic interference radiation from electrical component housings is enhanced due to an electrically conductive adapter rings each connected to associated electrically conductive cable shields. The rings and cables are engaged and retained by an electrically conductive bar attached to the housing and adapted to receive the rings, and thereby discharge electromagnetic signals to the housing ground potential.

12 Claims, 6 Drawing Figures

APPARATUS FOR LIMITING ELECTROMAGNETIC INTERFERENCE RADIATION

BACKGROUND OF THE INVENTION

1. Field of the Invention

This invention relates generally to electricity, conductors and insulators and more particularly to apparatus for electrically terminating a cable shield at a bulkhead adjacent an electronic equipment in a cabinet housing and limiting electromagnetic interference (EMI) radiation.

2. Description of the Prior Art

In computer equipment a central complex is located in a housing which encloses various components including a processor, power supply and an "L" module or line module having a plurality of printed circuit assemblies or cards each for supporting and interconnecting electronic circuitry. These cards function to interface processor control of the peripheral units which can include printers, disk drive, tape drive, card readers, etc. Each peripheral unit is also in a housing. Cables interconnect the cards with associated peripheral units.

Shielded, general purpose cable is usually comprised of a plurality of conductive strands wrapped by an electrically conductive shielding member such as, for example, aluminized Mylar or, preferably, braided copper. The shielding is for the purpose of limiting electromagnetic interference (EMI) radiation from the signal carrying conductors. The strands and shield are often encased in an electrically insulating wrap such as a rubberized or plasticized material. Such cables are used to transfer electrical signals between the central complex housing and each associated peripheral unit.

Within the central complex housing occurs much electronic activity often including the rapid switching of circuits. This activity produces EMI radiation within the housing. The shield of the cable picks up the EMI radiation from inside the central complex housing. If the electromagnetic signals are not discharged within the housing, the shield carries the radiation out of the housing where it is discharged and the cables act as antennae radiating the EMI outside of the housing.

There are legally imposed limits as to how much EMI radiation is permissible, therefore, attempts have been made to comply. In order to comply, it has been found to be desirable to electrically connect the shielding to the housing, which is normally grounded. Such grounding discharges the EMI radiation as it leaves the housing. One such attempt includes using "pigtail" type connectors comprised of a section of braided shielding material electrically connected at one end to the cable shield and connected at another end to the central complex housing. These pigtail connectors have been found to be limited in their effectiveness. They are most effective when they are relatively short in length, however, it is not always convenient to work with the short pigtail type connector.

Another common practice has been to utilize a shielded connector for each cable leaving a housing, where the connector shielding is electrically coupled to the housing. Such an arrangement inhibits any EMI signals from reaching the cable shield external to the housing, but is very expensive both in parts and labor to wire the connectors.

The foregoing illustrates limitations of the known prior art. Thus, it is apparent that it would be advantageous to provide an inexpensive alternative directed to overcoming one or more of the limitations as set forth above, while providing a structure that will not damage cable shielding and will provide axial support and positioning. Accordingly, a suitable alternative is provided including features more fully disclosed hereinafter.

SUMMARY OF THE INVENTION

In one aspect of the present invention, this is accomplished by providing apparatus for limiting EMI radiation including a cable having a plurality of conductive strands surrounded by an electrically conductive shield member. An electrically conductive adapter ring is carried by the cable with a portion of the ring in direct electrical contact with the shield. A cable retainer bar is provided and another portion of the ring is engaged in electrical contact with the retainer bar. The cable retainer bar is electrically coupled to housing ground, and provides a path for discharge of EMI within the housing.

The foregoing and other aspects will become apparent from the following detailed description of the invention when considered in conjunction with the accompanying drawings. It is to be expressly understood, however, that the drawings are not intended as a definition of the invention but are for the purpose of illustration only.

DESCRIPTION OF THE PREFERRED EMBODIMENT

Figure 1:
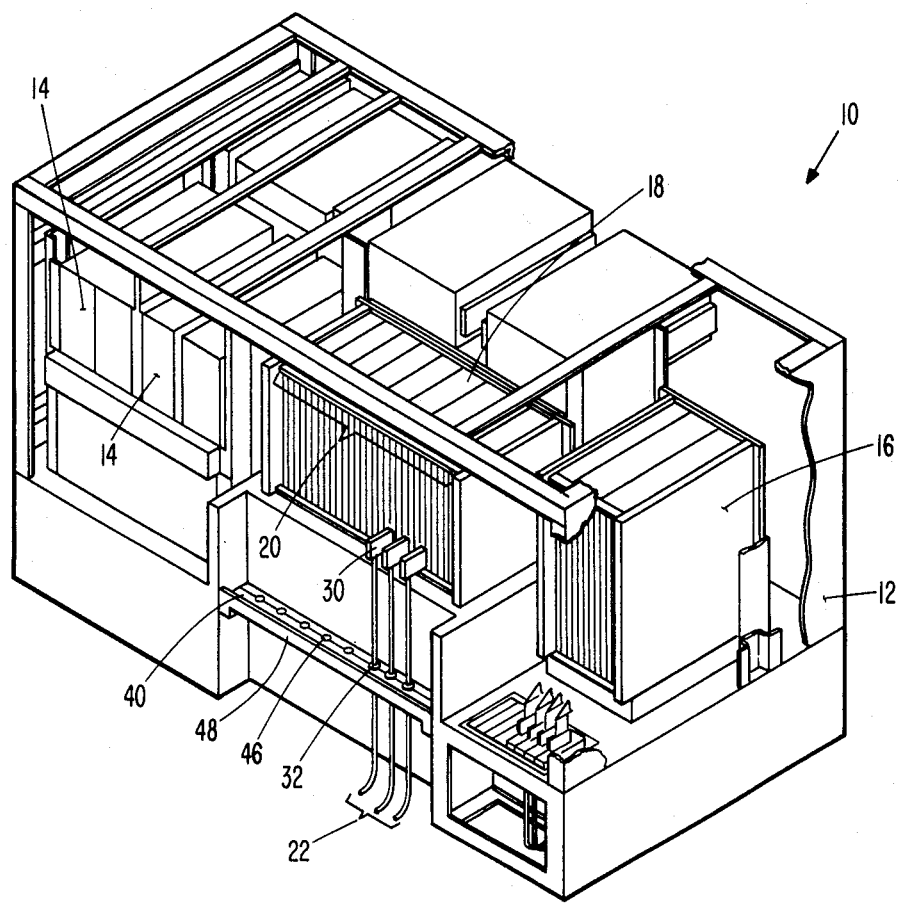
FIG. 1 is an isometric view illustrating a central complex housing in combination with an embodiment of a shield terminating apparatus of this invention.

FIG. 1 illustrates an exemplary central complex housing generally designated 10 and having portions of outer panels 12 removed for the purpose of revealing some of the components within. Housing 10 is usually formed of steel which is electrically conductive and electrically established at ground potential. Among the components typically found within housing 10, when used in connection with computer hardware equipment are power supplies 14, a processor 16 and an "L" module 18. A plurality of well-known circuit cards 20 are included in "L" module 18. The circuit cards 20 support electronic circuits that can cause electromagnetic radiation within housing 10.

Figure 2:
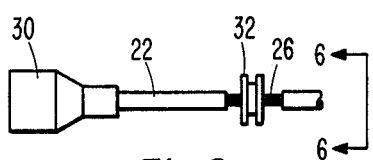
FIG. 2 is a view illustrating an embodiment of a cable and an adapter ring mounted thereon in accordance with this invention.
Figure 3:
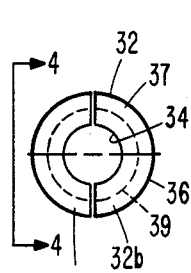
FIG. 3 is a view illustrating an embodiment of the adapter ring of this invention.
Figure 4:
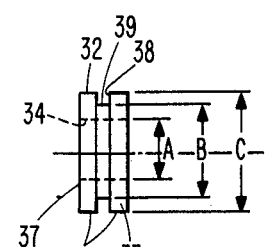
FIG. 4 is a view taken along line 4—4 of FIG. 3.
Figure 6:
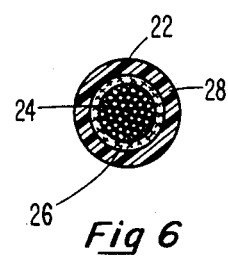
FIG. 6 is a view taken along line 6—6 of FIG. 2.

Cables 22, FIGS. 1, 2 and 6, are commonly used to connect cards 20 with associated peripheral units (not shown), such as printers, disk driver, tape drive, card readers and the like. The general, all purpose cables include a plurality of conductive strands 24 wrapped by a conductive, shield member 26, preferably of braided copper. Strands 24 and shield 26 are surrounded in an electrically insulating wrap 28 which is usually of a synthetic rubberized or plasticized material. Each cable 22 usually includes a plug 30 electrically coupled directly to a set of associated contacts on appropriate card 20.

In accordance with this invention an adapter ring 32, FIGS. 1, 2, 3 and 4 is generally of a toroidal shape and is formed by a pair of symmetrical halves 32a, 32b, of electrically conductive material such as die-cast aluminum, which permits ring 32 to be easily mounted on cable 22. A first annular surface 34 of ring 32 can be selected as a predetermined diameter, designated A in FIG. 4, in the range of from about 0.30 inch to about 0.42 inch, for the purposes of accommodating a plurality of possible various diameters for cable 22. The periphery 36 of ring 32 includes first and second annular flanges 37 spaced apart and forming annular groove 38 having a second annular surface 39. Surface 36 is designated as dimension C and surface 39 is designated as dimension B in FIG. 4. Dimension B is greater than dimension A and dimension C is greater than dimension B. It is of course understood that the toroidal shape is selected for use with a cable having a round cross-section, and that the shape of the ring would be adjusted to cooperate with other shaped cables.

Figure 5:
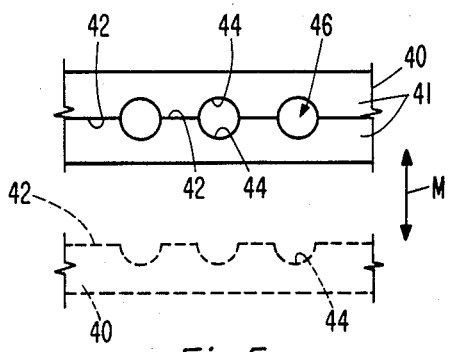
FIG. 5 is a view illustrating an embodiment of the retainer bar of this invention.

A retainer bar 40, FIGS. 1 and 5, is preferably formed of electrically conductive machined aluminum and includes a pair of similar halves 41. Each half portion of bar 40 is a substantially rigid strip having an edge 42 including a plurality of aligned, semicircular notches 44 formed therein. Each half portion can be abutted at mating edges 42 when the halves are moved toward each other as indicated by an arrow designated M, so that notches 44 form a plurality of apertures 46, each for engaging an associated ring 32 and retaining an associated cable 22. Bar 40 can be mounted and supported on a frame portion of housing 10 or on the panels 12 by a well-known method such as by attaching a supportive bracket 48 or the like. The similar halves 41 of bar 40 can then be seated a recess formed by bracket 48 or, if desired, secured in place by clips or screws or the like. The width of groove 38 is adjusted to mate with the thickness of retainer bar 40 such that flanges 37 engage associated surfaces thereof and make electrical contact therewith.

The invention is useful for the purpose of limiting EMI radiation which is generated in housing 10 and is carried from housing 10 via shielding member 26 of cable 22 and thus can be radiated outside the housing 10. To limit the EMI radiation, a portion of insulating layer 28 is removed from cable 22 thus exposing braided shielding member 26 as best illustrated in FIG. 2.

Adapter ring 32 having an appropriate dimension A for permitting surface 34 to directly electrically contact shield 26, is carried by cable 22. Symmetrical halves 32a, 32b of ring 32 are secured together by a commercially available aluminum-filled, heat curing, modified adhesive epoxy resin containing a latent hardener that is activated by high temperature. Such an adhesive is electrically conductive and is the product number 2214 HI-FLEX available from the 3M Company of St. Paul, Minn. In addition, the same adhesive is used to physically secure and electrically couple surface 34 of ring 32 directly to shield 26, without causing damage to the shield.

Surface 39 of ring 32 is engaged by cooperating notches 44 of an aperture 46 of retainer 40 when the similar halves 41 of the retainer are joined at abutting edges 42. The diameter of aperture 46 is only slightly greater than the diameter of dimension B of surface 39. Also, the diameter of dimension C of surface 36 is greater than the diameter of aperture 46. Further, the thickness of retainer 40 is slightly less than the space of groove 38 between flanges 37. In this manner, ring 32 retains cable 22 in retainer bar 40. Due to the electrically conductive path from shield 26, the adhesive, ring 32, retainer 40 and housing 10, EMI radiation is essentially grounded and limited to discharge within housing 10.

The foregoing has described apparatus for limiting EMI radiation through interconnection of a cable shield to a housing via an adapter ring and a cable retainer.

It is anticipated that aspects of the present invention other than those specifically defined in the appended claims, can be obtained from the foregoing description and the drawings.

What is claimed is:

1. Apparatus for limiting electromagnetic interference radiation from a housing containing sources of electromagnetic radiation comprising:
   a cable extending through the housing, said cable having a plurality of conductive strands, and an electrically conductive shield member surrounding said conductive strands;
   an electrically conductive cable retainer bar electrically connected to the housing; and
   an electrically conductive adapter ring carried by the cable, said ring having a first portion electrically coupled to said shield member, and a second portion in electrical contact with said cable retainer bar, whereby electromagnetic radiation picked up by said shield member within the housing is substantially drained through said adapter ring and said cable retainer bar to the housing.

2. The apparatus of claim 1 wherein said shield member is braided.

3. The apparatus of claim 1 and further including an insulating wrap surrounding at least a portion of said shield member wherein said insulating wrap includes an opening formed therein exposing another portion of said shield member for receiving said adapter ring.

4. The apparatus of claim 3 wherein said adapter ring is toroidal and said first portion of said adapter ring is a first annular surface and said second portion is a second annular surface.

5. Apparatus as in claim 4 wherein said adapter ring includes at least one flange member formed adjacent to at least a portion of said second annular surface, said flange member arranged for cooperating with one surface of said cable retainer bar for providing axial alignment of said cable and limiting longitudinal displacement of said cable in one direction with respect to said cable retainer bar.

6. The apparatus of claim 5 wherein said adapter ring includes a second flange member formed thereon and spaced apart from said first flange member, said second flange member for cooperating with another surface of said cable retainer bar and limiting longitudinal movement of said cable in a second direction.

7. The apparatus of claim 1 wherein said cable retainer bar includes at least two relatively movable pieces for opening and closing with at least one cable retaining aperture formed in said cable retainer bar.

8. The apparatus of claim 7 wherein said adapter ring is positioned within said aperture in said cable retainer bar and is retained in physical and electrical contact therewith.

9. The apparatus of claim 1 wherein said adapter ring includes at least two pieces secured together at mating surfaces by electrically conductive adhesive.

10. Apparatus of claim 9 wherein said adapter ring is affixed to said cable by electrically conductive adhesive.

11. In a computer hardware of the type including a central complex in a housing having a line module therein, and a cable having a shield member, said cable connected to the line module and extending from the housing, the improvement comprising:

- a multi-piece adapter ring carried by the cable, the ring having a first annular surface in direct contact with the shield; the pieces of the ring being adhered together and adhered to the shield by an electrically conductive adhesive;
- a retainer bar mounted on the housing, the retainer bar having an aperture therein; and
- a second annular surface of the adapter ring is engaged with the retainer bar aperture.

12. In combination with a housing containing computer hardware equipment therein, apparatus for limiting electromagnetic interference radiation to said housing, comprising:

- a cable having one end thereof electrically coupled to said equipment, the cable having a shield member covered by an insulative wrap, a portion of said wrap removed to expose a portion of said shield;
- an adapter ring carried by the cable, the ring having a portion in direct contact with the exposed portion of the shield;
- a retainer bar mounted on the housing; and
- another portion of the ring engaged with the retainer bar.

* * * * *